(12) United States Patent
Hasegawa et al.

(10) Patent No.: US 11,765,832 B2
(45) Date of Patent: Sep. 19, 2023

(54) PRINTED CIRCUIT BOARD AND ELECTRONIC DEVICE

(71) Applicant: CANON KABUSHIKI KAISHA, Tokyo (JP)

(72) Inventors: Mitsutoshi Hasegawa, Yokohama (JP); Kunihiko Minegishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/581,940

(22) Filed: Sep. 25, 2019

(65) Prior Publication Data

US 2020/0113056 A1    Apr. 9, 2020

(30) Foreign Application Priority Data

Oct. 3, 2018   (JP) ................. 2018-188696

(51) Int. Cl.
*H05K 1/18*       (2006.01)
*H05K 3/40*       (2006.01)
(Continued)

(52) U.S. Cl.
CPC ............ *H05K 1/181* (2013.01); *H05K 1/113* (2013.01); *H05K 3/3436* (2013.01);
(Continued)

(58) Field of Classification Search
CPC .... H05K 1/181; H05K 3/3485; H05K 3/4007; H05K 3/3436; H05K 3/3452;
(Continued)

(56) References Cited

U.S. PATENT DOCUMENTS 5,838,097 A     11/1998  Kasanuki et al.
5,844,782 A  *  12/1998  Fukasawa ......... H01L 23/49816
                                               361/774
(Continued)

FOREIGN PATENT DOCUMENTS

JP     H09-219583 A    8/1997
JP     2014-060200 A   4/2014

OTHER PUBLICATIONS

Dictionary.com Definition of within [online] [retrieved on Mar. 24, 2022] Retrieved from the internet: <URL: https://www.dictionary.com/browse/within>. (Year: 2022).*

(Continued)

*Primary Examiner* — Jason A Flohre
(74) *Attorney, Agent, or Firm* — Venable LLP

(57) ABSTRACT

A printed circuit board includes an electronic component including a first land, a printed wiring board including a resist portion and a second land, and a connecting portion interconnecting the first land and the second land. An opening larger than the first land in plan view from the electronic component side is defined in the resist portion. In plan view from the electronic component side, the first land is disposed inside the opening, the second land including a body portion disposed inside the opening and a protruding portion protruding from the body portion, the body portion being disposed further on an inside than an outer edge of the first land, and at least part of the protruding portion protruding further to an outside than the first land.

20 Claims, 14 Drawing Sheets

(51) Int. Cl.
*H05K 3/34* (2006.01)
*H05K 1/11* (2006.01)

(52) U.S. Cl.
CPC ......... *H05K 3/3452* (2013.01); *H05K 3/3485* (2020.08); *H05K 3/4007* (2013.01); *H05K 2201/099* (2013.01); *H05K 2201/10121* (2013.01); *H05K 2201/10151* (2013.01)

(58) Field of Classification Search
CPC ......... H05K 1/113; H05K 2201/10151; H05K 2201/099; H05K 2201/10121; H05K 1/0269; H05K 2201/09427; H05K 1/111; H05K 2201/094; Y02P 70/50; H01L 2924/15153; H01L 2924/15311; H01L 24/13; H01L 24/11; H01L 2224/13015; H01L 2224/13013; H01L 2224/13014; H01L 2224/13023; H01L 2224/1111; H01L 23/49838
See application file for complete search history.

(56) References Cited

U.S. PATENT DOCUMENTS

| | | | | |
|---|---|---|---|---|
| 6,316,735 | B1 * | 11/2001 | Higashiguchi | H05K 3/3436 174/260 |
| 6,443,351 | B1 * | 9/2002 | Huang | H05K 3/3436 228/103 |
| 7,034,809 | B2 | 4/2006 | Hasegawa | |
| 7,183,652 | B2 * | 2/2007 | Waidhas | H01L 23/3128 257/772 |
| 2001/0054753 | A1 * | 12/2001 | Oya | H05K 3/3452 257/676 |
| 2005/0230824 | A1 * | 10/2005 | Watanabe | H05K 3/303 257/735 |
| 2006/0244142 | A1 * | 11/2006 | Waidhas | H01L 23/3128 257/738 |
| 2007/0057022 | A1 * | 3/2007 | Mogami | H05K 3/3436 228/101 |
| 2007/0253148 | A1 * | 11/2007 | Ishizaki | H05K 1/111 361/600 |
| 2008/0093749 | A1 * | 4/2008 | Gerber | H01L 23/49816 257/784 |
| 2009/0196003 | A1 * | 8/2009 | Fujii | H01L 23/49838 361/783 |
| 2010/0084177 | A1 * | 4/2010 | Kumakura | H05K 1/141 174/261 |
| 2011/0110050 | A1 * | 5/2011 | Sakatani | H01L 21/563 361/746 |
| 2013/0320569 | A1 * | 12/2013 | Aoki | H01L 25/105 257/777 |
| 2014/0076623 | A1 | 3/2014 | Yamamoto | |
| 2015/0068791 | A1 * | 3/2015 | Nakamura | H05K 1/111 174/257 |
| 2015/0137349 | A1 * | 5/2015 | Chen | H01L 24/06 257/737 |
| 2015/0179615 | A1 * | 6/2015 | Watanabe | H01L 25/50 257/737 |
| 2015/0195911 | A1 | 7/2015 | Yamamoto | |
| 2015/0340335 | A1 * | 11/2015 | Maruko | H01L 24/02 361/767 |
| 2016/0042526 | A1 * | 2/2016 | Lee | H04N 5/232122 348/351 |
| 2016/0126153 | A1 * | 5/2016 | Minegishi | H01L 27/14636 257/701 |
| 2017/0092608 | A1 | 3/2017 | Cai et al. | |

OTHER PUBLICATIONS

Co-Pending U.S. Appl. No. 16/741,913, filed Jan. 14, 2020.
Mar. 4, 2020 Combined Search and Examination Report in United Kingdom Patent Application No. GB19137306.6.

* cited by examiner

FIG.7

| PATTERN | (1) | (2) | (3) | (4) | (5) | (6) | (7) |
|---|---|---|---|---|---|---|---|
| X-RAY TRANSMISSION IMAGE | | | | | | | |
| SECTION VIIA-VIIA | | | | | | | |
| SECTION VIIB-VIIB | | | | | | | |
| EVALUATION | C | C | A | A | A | B | B |

FIG.13

| CONNECTING PORTION | 400B | | | | 400A | | |
|---|---|---|---|---|---|---|---|
| X-RAY TRANSMISSION IMAGE | | | | | | | |
| EVALUATION | A or B | | | | | | |

US 11,765,832 B2

PRINTED CIRCUIT BOARD AND ELECTRONIC DEVICE

BACKGROUND OF THE INVENTION

Field of the Invention

The present invention relates to a technique of interconnecting an electronic component and a printed wiring board.

Description of the Related Art

An electronic device such as a digital camera serving as an example of an image pickup apparatus or a smartphone including a camera serving as an image pickup apparatus includes a printed circuit board including an electronic component such as an image sensor and a printed wiring board on which the electronic component is mounted.

Accompanied by miniaturization of electronic device, the electronic component has been also miniaturized. A land of the electronic component and a land of the printed wiring board are interconnected by a bump containing solder and serving as an example of a connecting portion, and the bump is also miniaturized in accordance with the miniaturization of electronic component. Accompanied by the miniaturization of bump, a problem of connection failure of the bump has arisen. Japanese Patent Laid-Open No. 9-219583 discloses forming a shape of a pad, that is, a land of a printed wiring board in a concavo-convex shape and determining that an open failure has occurred when an X-ray transmission image of the bump has a circular shape.

However, even in the case where the land is formed in a concavo-convex shape as disclosed in Japanese Patent Laid-Open No. 9-219583, in some cases, the bump protrudes from the land of the printed wiring board, thus the X-ray transmission image of the bump has the same shape as the shape of an open failure, and therefore it is difficult to determine whether or not an open failure has occurred.

SUMMARY OF THE INVENTION

According to one aspect of the present invention, a printed circuit board includes an electronic component including a first land, a printed wiring board including a resist portion and a second land, and a connecting portion interconnecting the first land and the second land. An opening larger than the first land in plan view from the electronic component side is defined in the resist portion. In plan view from the electronic component side, the first land is disposed inside the opening, the second land including a body portion disposed inside the opening and a protruding portion protruding from the body portion, the body portion being disposed further on an inside than an outer edge of the first land, and at least part of the protruding portion protruding further to an outside than the first land.

Further features of the present invention will become apparent from the following description of exemplary embodiments with reference to the attached drawings.

BRIEF DESCRIPTION OF THE DRAWINGS

FIG. 7 is an explanatory diagram of an inspection step using an X-ray transmission image according to the first exemplary embodiment.

FIG. 13 is an explanatory diagram of an inspection step using an X-ray transmission image according to the second exemplary embodiment.

DESCRIPTION OF THE EMBODIMENTS

Exemplary embodiments of the present invention will be described in detail below with reference to drawings.

First Exemplary Embodiment

Figure 1:
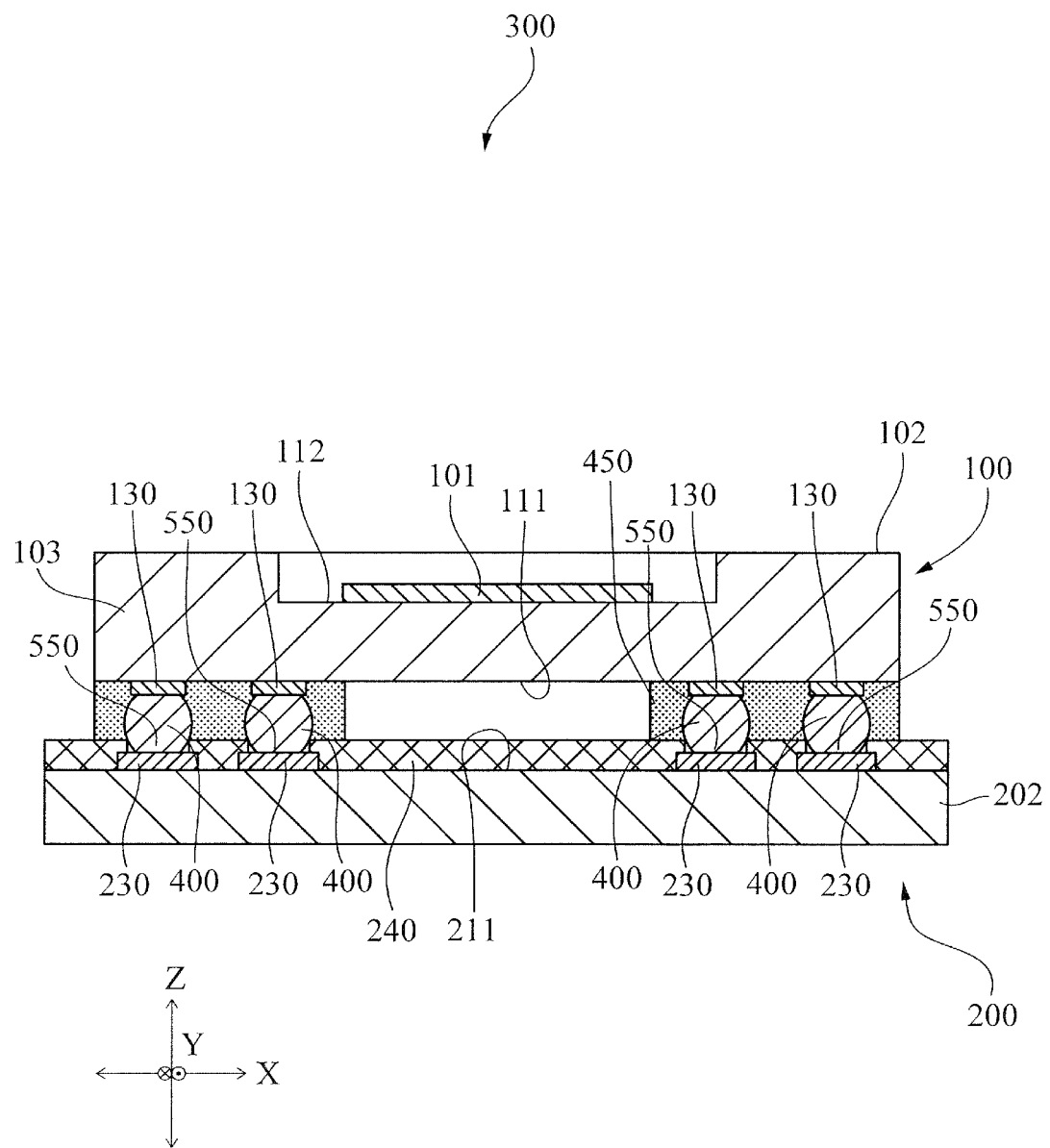
FIG. 1 is a section view of a printed circuit board according to a first exemplary embodiment.

FIG. 1 is a section view of a printed circuit board 300 according to the first exemplary embodiment. The printed circuit board 300 includes an electronic component 100 and a printed wiring board 200 on which the electronic component 100 is mounted. The electronic component 100 is a package of a land grid array: LGA. To be noted, the electronic component 100 may alternatively be a package of a ball grid array: BGA. The electronic component 100 includes a semiconductor element 101 and a package substrate 102 on which the semiconductor element 101 is mounted. The package substrate 102 includes an insulating substrate 103 and lands 130 serving as a plurality of first lands disposed on a main surface 111 of the insulating substrate 103. The semiconductor element 101 is disposed on a surface 112 of the insulating substrate 103 opposite to the main surface 111. The lands 130 are electrodes formed from conductive metal such as copper, and, for example, are each a signal electrode, a power source electrode, a ground electrode, or a dummy electrode. The main surface 111 is parallel to an X-Y plane defined by an X direction and a Y direction. In addition, an out-of-plane direction perpendicular to the main surface 111 is defined as a Z direction. For example, the insulating substrate 103 is a ceramic substrate formed from a ceramic such as alumina.

The printed wiring board 200 includes an insulating substrate 202 and lands 230 serving as a plurality of second lands disposed on a main surface 211 of the insulating substrate 202. The lands 230 are electrodes formed from conductive metal such as copper, and, for example, are each a signal electrode, a power source electrode, a ground electrode, or a dummy electrode. The insulating substrate 202 is formed from an insulating material such as epoxy resin.

A solder resist film 240 serving as an example of a resist portion is provided on the main surface 211. In the solder resist film 240, openings 550 are defined at positions corresponding to the lands 230.

The lands 130 and the lands 230 are electrically and mechanically connected to each other by connecting portions 400 containing solder. The lands 230 are connected to the lands 130 by the connecting portions 400 through the openings 550 of the solder resist film 240. In plan view from the Z direction, the connecting portions 400 are surrounded by resin portions 450 serving as underfill. The resin portions 450 is mainly formed from a cured product of a curable resin. For example, the curable resin is a thermosetting resin. In the present exemplary embodiment, the plurality of connecting portions 400 are surrounded by one integrated resin portion 450. To be noted, although it is preferable that the plurality of connecting portions 400 are surrounded by the one integrated resin portion 450, the configuration is not limited to this, and the plurality of connecting portions 400 may be surrounded by a plurality of separate resin portions.

Figure 2A:
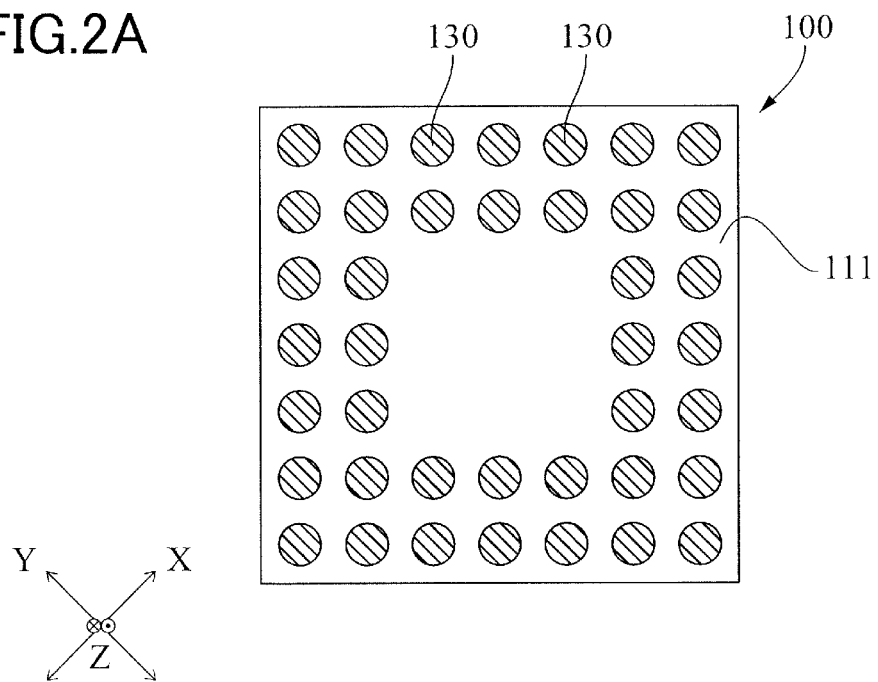
FIG. 2A is a plan view of an electronic component according to the first exemplary embodiment.
Figure 2B:
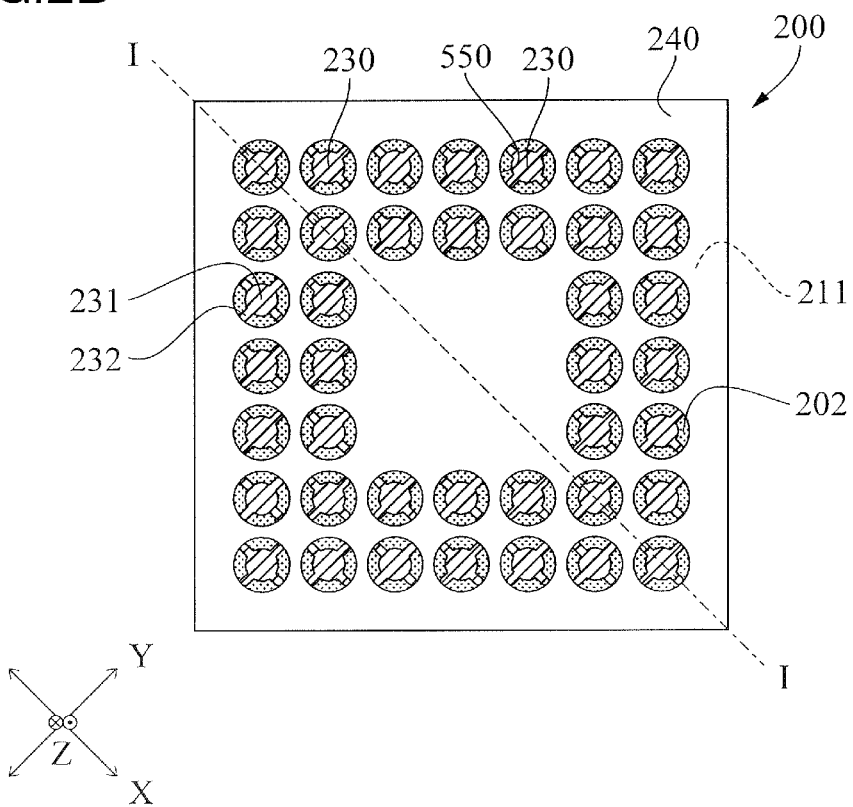
FIG. 2B is a plan view of a printed wiring board according to the first exemplary embodiment.

FIG. 2A is a plan view of the electronic component 100 as viewed from the main surface 111 side. FIG. 2B is a plan view of the printed wiring board 200 as viewed from the main surface 211 side. To be noted, a section view of the printed circuit board 300 illustrated in FIG. 1 is a section view taken along a line I-I of FIG. 2B. As illustrated in FIG. 2A, the plurality of lands 130 are arranged with intervals therebetween in a grid shape, that is, a square lattice shape. As illustrated in FIG. 2B, the plurality of lands 230 are arranged with intervals therebetween in a grid shape, that is, a square lattice shape. The lands 230 each include a body portion 231 serving as a main body of the land 230, and a protruding portion 232 protruding from the body portion 231. Although most part of the main surface 211 of the insulating substrate 202 is covered by the solder resist film 240, the solder resist film 240 is provided with the openings 550, and the lands 230 are disposed in the openings 550.

A method for manufacturing the printed circuit board 300 and a method for inspecting the manufactured printed circuit board 300 will be described. FIGS. 3A to 3C and FIGS. 4A to 4C are each an explanatory diagram of each step of the method for manufacturing the printed circuit board 300 illustrated in FIG. 1, and FIG. 5 is an explanatory diagram of a step of the method for inspecting the printed circuit board 300.

Figure 3A:
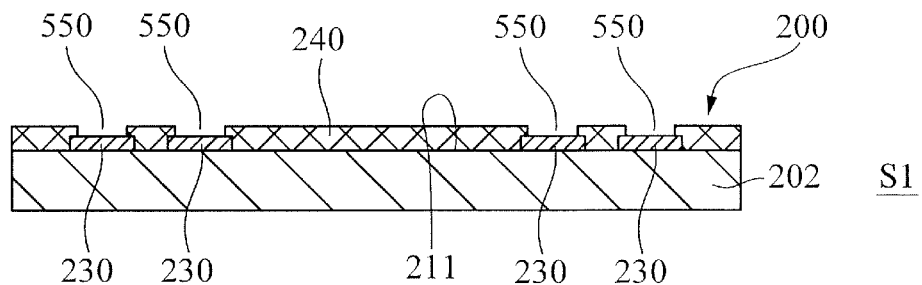
FIGS. 3A to 3C are each an explanatory diagram for describing each step of a method for manufacturing the printed circuit board according to the first exemplary embodiment.

In step S1, the printed wiring board 200 is prepared as illustrated in FIG. 3A. To be noted, although illustration is omitted herein, the electronic component 100 is also prepared on an unillustrated mounter.

Figure 3B:
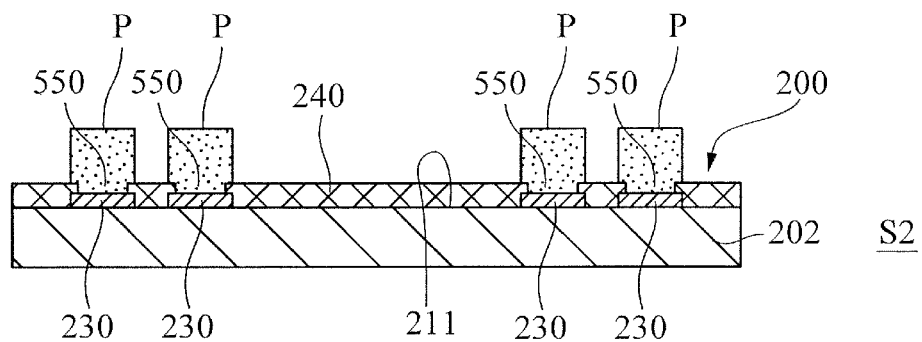

Next, in step S2, a paste P is disposed on one or both of the lands 130 illustrated in FIG. 2A and the lands 230 illustrated in FIG. 2B. In the present exemplary embodiment, the paste P is disposed on the lands 230 as illustrated in FIG. 3B.

The paste P is a solder paste containing solder powder. In the present exemplary embodiment, the paste P further contains an uncured thermosetting resin. The thermosetting resin is preferably a thermosetting epoxy resin, and particularly preferably bisphenol-A epoxy resin. The paste P may further contain a flux component required for soldering.

In step S2, the paste P is supplied to the printed wiring board 200 by screen printing or using a dispenser. To be noted, the solder paste P may be supplied to cover the entirety of the body portions 231 of the lands 230 illustrated in FIG. 2B or supplied to cover parts of the body portions 231. In the present exemplary embodiment, the paste P is supplied to the printed wiring board 200 such that the entirety of the openings 550 is filled with the paste P.

Figure 3C:
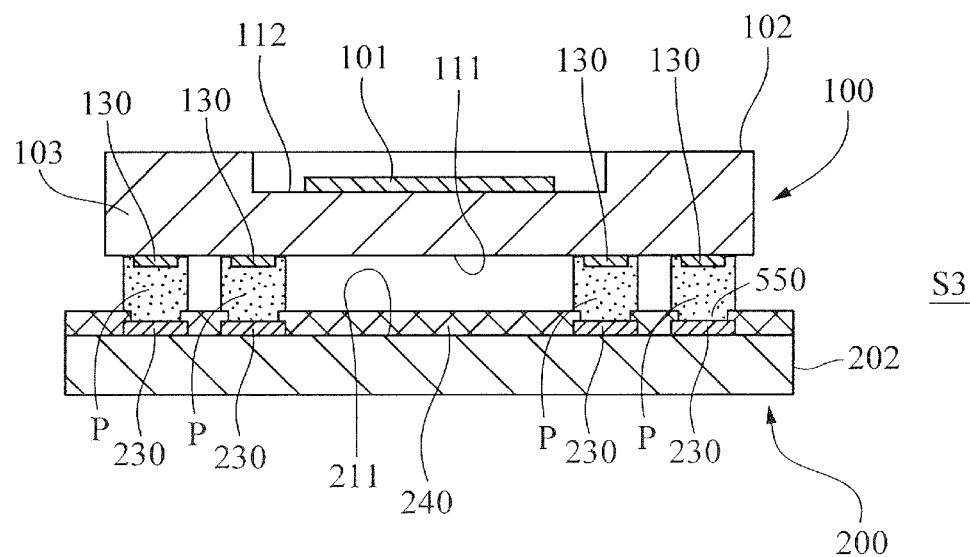

Next, in step S3, the electronic component 100 is placed on the printed wiring board 200 such that each paste P interposed between the land 130 and the land 230 as illustrated in FIG. 3C. In the present exemplary embodiment, in step S3, the electronic component 100 is placed on the printed wiring board 200 by using the unillustrated mounter. At this time, the electronic component 100 is aligned with and placed on the printed wiring board 200 such that the lands 130 are opposed to the lands 230.

Figure 4A:
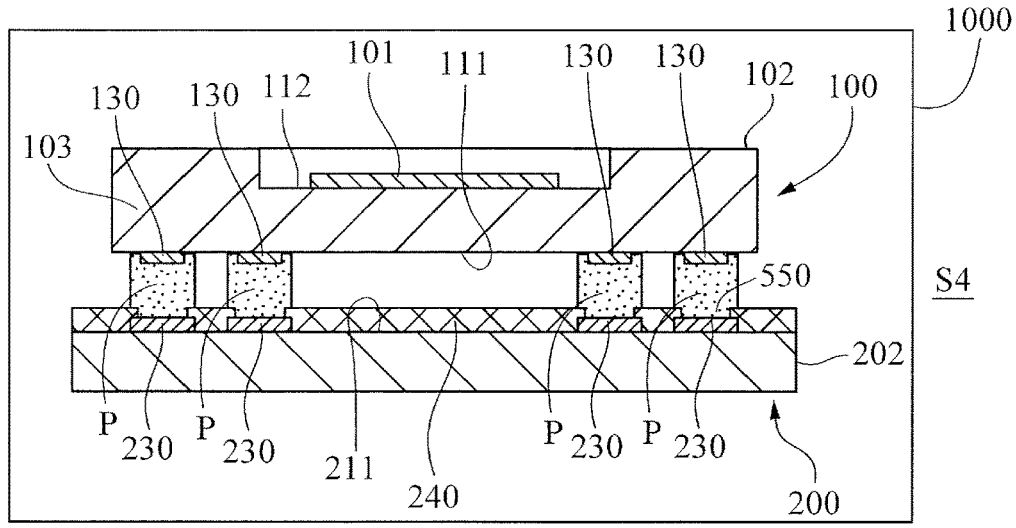
FIGS. 4A to 4C are each an explanatory diagram for describing each step of a method for manufacturing the printed circuit board according to the first exemplary embodiment.
Figure 4B:
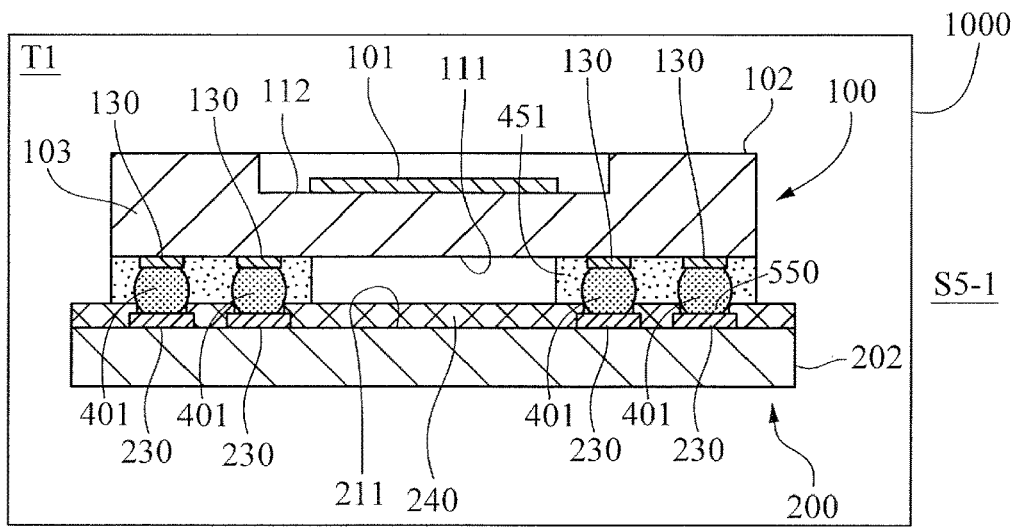

Next, in step S4, the printed wiring board 200 and the electronic component 100 are conveyed to a reflow furnace 1000 in a state in which the electronic component 100 is placed on the printed wiring board 200 as illustrated in FIG. 4A. Then, in step S5-1 illustrated in FIG. 4B and step S5-2 illustrated in FIG. 4C, the paste P is heated while adjusting the temperature inside the reflow furnace 1000, that is, the heating temperature, and thus the electronic component 100 and the printed wiring board 200 are bonded to each other.

First, step S5-1 illustrated in FIG. 4B will be described. In step S5-1, the temperature inside the reflow furnace 1000 is adjusted to a first temperature T1 equal to or higher than the melting point of the solder powder contained in the paste P. As a result of this, the solder powder of the pastes P is melted, and the paste P is separated into a molten solder 401 and an uncured thermosetting resin 451. Specifically, the molten solder 401 aggregates, and thus the thermosetting resin 451 moves to the vicinity of the molten solder 401. Although the first temperature T1 is preferably constant over time, the first temperature T1 may change over time.

In step S5-1, the paste P is separated into the aggregated molten solder 401 and the uncured thermosetting resin 451 having flowed to the vicinity of the molten solder 401. At this time, the surface area of the uncured thermosetting resin 451 is smaller than in the paste state, and thus the viscosity thereof apparently decreases and the fluidity thereof increases. The thermosetting resin 451 whose fluidity has increased flows to narrow gaps by a capillary phenomenon.

Figure 4C:
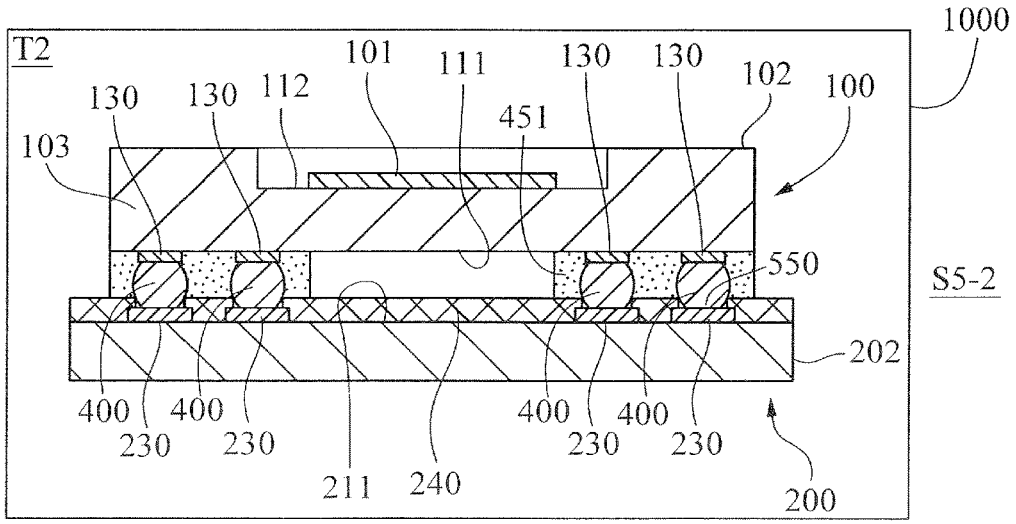
Figure 5:
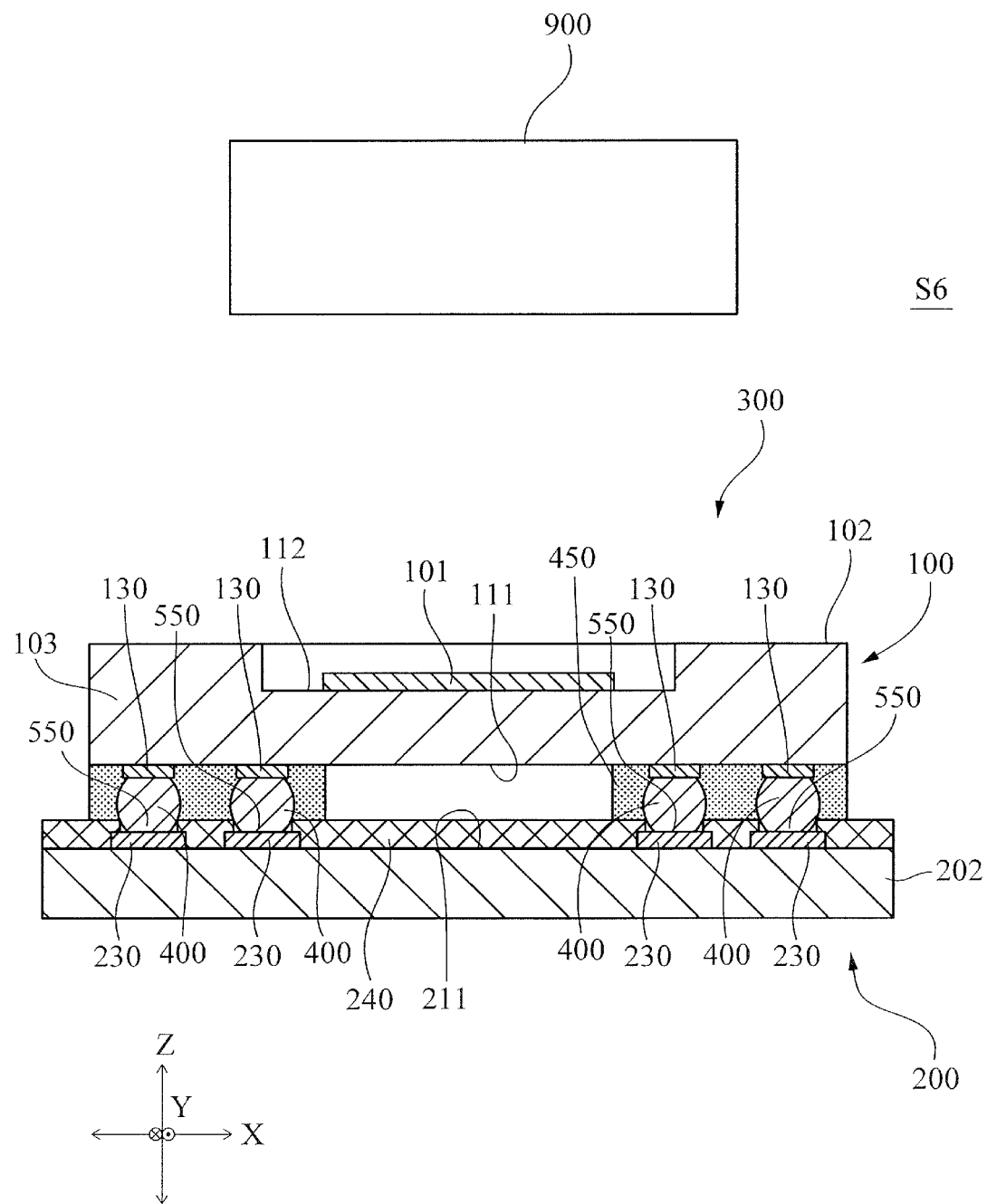
FIG. 5 is an explanatory diagram of a step of a method for inspecting the printed circuit board according to the first exemplary embodiment.

Then, in step S5-2 illustrated in FIG. 4C, the temperature inside the reflow furnace 1000 is adjusted to a second temperature T2 lower than the melting point of the solder powder, and thus the molten solder 401 is solidified. That is, T2<T1 holds. As a result of this, the connecting portions 400 interconnecting the lands 130 and the lands 230 are formed.

The second temperature T2 is also a temperature at which the thermosetting resin 451 is cured, and the temperature inside the reflow furnace 1000 is kept at the second temperature T2 for a period equal to or longer than a predetermined time required for the thermosetting resin 451 to be cured. As a result of this, the thermosetting resin 451 is gradually cured, and thus the resin portions 450 illustrated in FIG. 1 are formed. Although the second temperature T2 is preferably constant over time, the second temperature T2 may change over time.

The connecting portions 400, more specifically contact portions between the connecting portions 400 and the lands 130 and contact portions between the connecting portions 400 and the lands 230 are reinforced by the resin portions 450 illustrated in FIG. 1, and thus the reliability of connection by the connecting portions 400 is improved. In addition, the resin portions 450 connect the electronic component 100 to the solder resist film 240 of the printed wiring board 200.

To be noted, although a case where step S5-1 illustrated in FIG. 4B and step S5-2 illustrated in FIG. 4C are continuously performed in the same reflow furnace 1000 has been described, the configuration is not limited to this. In the case where the size of the reflow furnace 1000 is small and sufficient time for step S5-2 cannot be secured, an intermediate product may be moved to an unillustrated heating furnace after the heating in the reflow furnace 1000 of step S5-1, and then the thermosetting resin 451 may be heated to the second temperature T2 to cure.

By manufacturing the printed circuit board 300 by using the paste P containing a thermosetting resin, solder bonding and formation of underfill can be simultaneously performed by only performing the heating steps S5-1 and S5-2. That is, although the paste P may be a paste that contains solder powder but does not contain a thermosetting resin, a step for injecting an underfill material can be omitted by using the paste P containing a thermosetting resin in the present exemplary embodiment. Therefore, the printed circuit board 300 can be easily manufactured.

Next, in an image capturing step S6, an image of the manufactured printed circuit board 300 is captured from the Z direction by an X-ray image pickup apparatus 900 as illustrated in FIG. 5. Whether the quality of the connecting portions 400 is good or not is determined by visually observing an X-ray transmission image obtained by this image capturing by human eyes or subjecting the X-ray transmission image to image analysis by a computer. This serves as an inspection step. In the X-ray transmission image, the connecting portions 400 containing solder have different contrast from an insulating material, and therefore a person visually observing the X-ray transmission image displayed on a monitor or the like can easily recognize the connecting portions 400.

Figure 6A:
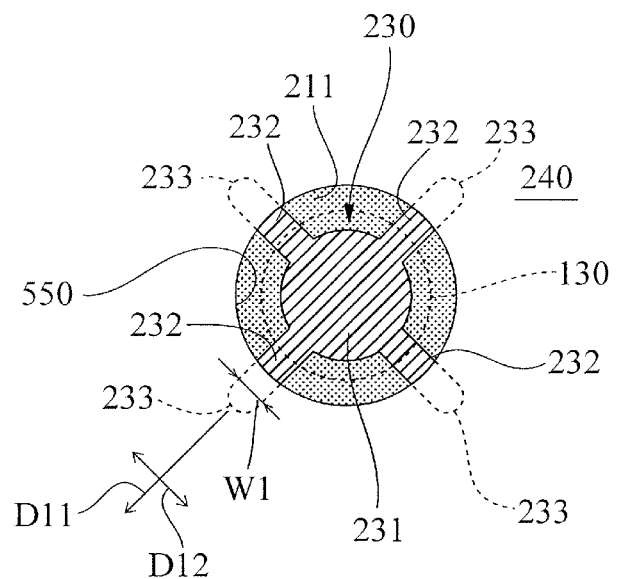
FIG. 6A is an enlarged plan view of a part of the printed wiring board according to the first exemplary embodiment.

FIG. 6A is an enlarged plan view of a land 230 and the vicinity of the land 230, which is a part of the printed wiring board 200 according to the first exemplary embodiment. To be noted, in FIG. 6A, a land 130 of the electronic component 100 is indicated by a broken line for the sake of convenience of description.

The land 230 includes a body portion 231, and protruding portions 232 protruding from the body portion 231. Although the number of protruding portions 232 included in the land 230 may be one or two, the number of protruding portions 232 included in the land 230 is preferably 3 or more, and is 4 in the present exemplary embodiment. The protruding portions 232 are formed to extend radially from the outer periphery of the body portion 231 in plan view from the Z direction. The four protruding portions 232 are arranged at approximately even intervals, that is, at intervals of 90°, in the peripheral direction of the body portion 231. In plan view from the Z direction, the entirety of the body portion 231 is formed in an opening 550 of the solder resist film 240, and part or entirety of each protruding portion 232 is formed in the opening 550 of the solder resist film 240. In the present exemplary embodiment, part of each protruding portion 232 is formed in the opening 550. The area of the body portion 231 in the opening 550 is preferably larger than the total area of the plurality of protruding portions 232, and the body portion 231 serves as a main part of solder bonding.

The lands 130 of the electronic component 100 are formed in circular shapes in plan view from the Z direction. The body portions 231 of the lands 230 are formed in circular shapes in plan view from the Z direction. The openings 550 of the solder resist film 240 are formed in circular shapes in plan view from the Z direction. The openings 550 of the solder resist film 240 are defined to be larger than the lands 130 in plan view from the Z direction.

The body portions 231 are formed to be smaller than the lands 130 in plan view from the Z direction. Therefore, the molten solder 401 illustrated in FIG. 4B also wet-spreads toward the outside of the body portions 231. In addition, side walls of the openings 550 of the solder resist film 240 also have a role of holding back the molten solder 401. Excessive wet-spreading of the molten solder 401 is suppressed by the side walls of the openings 550.

By adjusting the areas of the body portions 231, a contracting force of reducing the distance between the electronic component 100 and the printed wiring board 200 and a resistive force caused by surface tension of a portion of the molten solder 401 in contact with the insulating material of the insulating substrate 202 and the solder resist film 240 are generated in the molten solder 401. The height of the molten solder 401 in the Z direction is controlled by the balance between these forces. In the case where the electronic component 100 is an LGA package, particularly in the case where the printed circuit board 300 is manufactured by using the solder paste P containing a thermosetting resin, the amount of solder is smaller than in the case of a BGA package, and therefore controlling the height of the molten solder 401 in the Z direction is important. Therefore, in the present exemplary embodiment, the body portions 231 of the lands 230 are formed to be smaller than the lands 130. However, in a situation in which the molten solder protrudes from the lands of the printed wiring board, merely forming the lands of the printed wiring board in concavo-convex shapes does not prevent almost all the connecting portions from appearing as circular shapes in the X-ray transmission image.

Therefore, in the present exemplary embodiment, the protruding portions 232 are formed to protrude further to the outside than the lands 130 in plan view from the Z direction. The shapes of the connecting portions 400 are controlled by the protruding portions 232. In the case where an open failure has not occurred, that is, in the case where the connecting state of the connecting portions 400 is good, the connecting portions 400 wet-spread along the protruding portions 232 having high wettability. That is, in the openings 550, the connecting portions 400 are formed to wet-spread on the body portions 231, on the plurality of protruding portions 232, and on portions between adjacent protruding portions among the plurality of protruding portions 232. Solder more easily wet-spreads on the protruding portions 232 than on the portions of the main surface 211 of the insulating substrate 202 between the adjacent protruding portions 232. Therefore, if the amount of solder is optimum, the connecting portions 400 have shapes corresponding to the protruding portions 232 that are different from circular shapes in plan view.

The lands 130 also appear as shades in the X-ray transmission image. Therefore, in the case where the protruding portions 232 protrude further to the outside than the lands 130, the connecting portions 400 appear as images larger than and having different shapes from the lands 130 in the X-ray transmission image unless an open failure has occurred in the connecting portions 400. From the viewpoint of controlling the shapes of the connecting portions 400, the number of protruding portions 232 of each land 230 is preferably 3 or more such that a user can easily identify the shapes of the connecting portions 400 in the X-ray transmission image. By setting the number of protruding portions 232 of each land 230 to 3 or more, the connecting portions 400 becomes more likely to appear as approximately polygonal shapes, which can be easily identified by the user, in the X-ray transmission image. Particularly, the number of protruding portions 232 of each land 230 is preferably 4 to 6. By setting the number of protruding portions 232 of each land 230 to 4 to 6, the connecting portions 400 becomes more likely to appear as approximately quadrangular shapes, approximately pentagonal shapes, or approximately hexagonal shapes, which can be particularly easily identified by the user among the approximately polygonal shapes, in the X-ray transmission image. The number of the protruding portions 232 of each land 230 is particularly preferably 4 among 4 to 6 because the connecting portions 400 are likely to appear as approximately quadrangular shapes, which can be particularly easily identified by the user, in the X-ray transmission image.

The maximum width W1 of each protruding portion 232 in a width direction D12 of the protruding portion 232 perpendicular to a protruding direction D11 thereof may be constant in the protruding direction D11, or may be gradually smaller at a position closer to a distal end 233 thereof in the protruding direction D11. The minimum width of each protruding portion 232 depends on the type and supply amount of the paste, and surface roughness of, material of the lands of, and manufacturing process of the printed wiring board and of the electronic component, and may be of any value as long as the molten solder 401 illustrated in FIG. 4B can wet-spread along the protruding portions 232. Specifically, from the viewpoint of controlling the shapes of the connecting portions 400, the maximum width W1 of each protruding portion 232 is preferably 10 μM or more such that the molten solder easily wet-spreads in the protruding direction D11. This is because it is difficult for the molten solder 401 to wet-spread along the protruding portions 232 in the case where the maximum width W1 is smaller than 10 μm. In the case where the number of protruding portions 232 of each land 230 is 4 to 6, the maximum width W1 is preferably 50 μm to 300 μm from the viewpoint of controlling the shapes of the connecting portions 400.

The distal end 233 of each protruding portion 232 is preferably covered by the solder resist film 240. This prevents the protruding portions 232, that is, the lands 230 from peeling off from the main surface 211 of the insulating substrate 202, and thus improves the reliability of connection by the connecting portions 400.

Figure 6B:
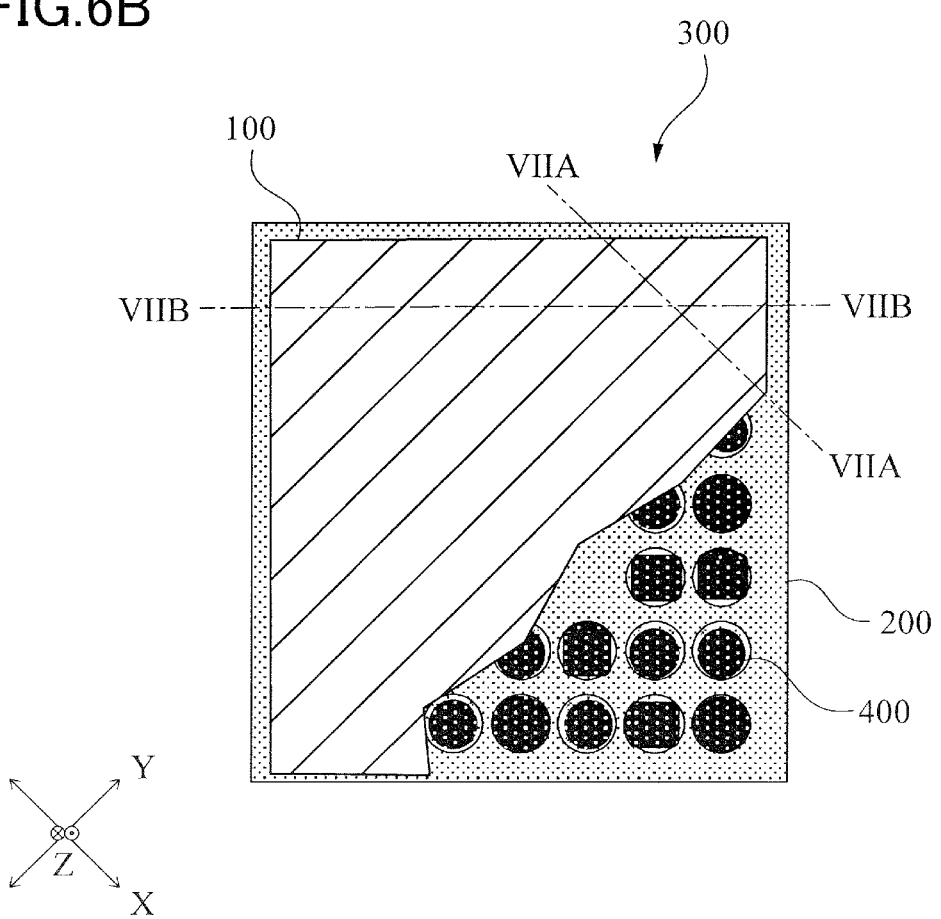
FIG. 6B is an explanatory diagram of the printed circuit board according to the first exemplary embodiment.

FIG. 6B is an explanatory diagram in which part of the electronic component 100 is omitted in the printed circuit board 300. FIG. 7 is an explanatory diagram of the inspection step using the X-ray transmission image according to the first exemplary embodiment. FIG. 7 illustrates patterns (1) to (7) of X-ray transmission images, sections taken along lines VIIA-VIIA and VIIB-VIIB of FIG. 6B, and results of evaluation of the patterns (1) to (7). An evaluation result "A" corresponds to "Very good", an evaluation result "B" corresponds to "Good", and neither of these indicates an open failure. An evaluation result "C" indicates that "there is a possibility of open failure", and indicates that a conduction test to determine whether an open failure has occurred is needed.

In step S5-1 illustrated in FIG. 4B, the molten solder 401 is interposed between the lands 130 of the electronic component 100 and the lands 230 of the printed wiring board 200, and spreads in a direction parallel to the main surface 211. Since the lands 130 and 230 are formed from metal, the lands 130 and 230 have higher wettability with solder than the surface of the solder resist film 240 formed from resin, the surface of the insulating substrate of the printed wiring board 200, and the surface of the insulating substrate of the electronic component 100. The aggregated molten solder 401 first wet-spreads on the lands 130 and the body portions 231 of the lands 230, which have high wettability. In the case where the molten solder 401 is solidified in this state, since the lands 130 are larger than the body portions 231 of the lands 230, the connecting portions 400 appear as circular shapes having the same sizes as the lands 130 in the X-ray transmission image, and an X-ray transmission image like the pattern (2) of FIG. 7 is obtained. To be noted, also in the case where an open failure has occurred in the connecting portions 400, the connecting portions 400 appear as circular shapes having the same sizes as the lands 130 in the X-ray transmission image, and an X-ray transmission image like the pattern (1) of FIG. 7 is obtained. In both cases of the patterns (1) and (2), the part of the protruding portions 232 protruding further to the outside than the lands 130 in the openings 550 of the solder resist film 240 appear in a different contrast from the insulating material therearound in the X-ray transmission image. That is, the protruding portions 232 have a different contrast from the insulating material therearound, and therefore can be distinguished from the insulating material in the X-ray transmission image. To be noted, the part of the protruding portions 232 covered by the solder resist film 240 has an unclear contrast, and therefore can be distinguished from a part positioned in the openings 550 in the X-ray transmission image. In a case corresponding to either one of the patterns (1) and (2), the evaluation result is "C".

In the case where the molten solder 401 is not cooled enough and is not solidified in the state of the pattern (2), the molten solder 401 further wet-spreads toward the edges of the openings 550 of the solder resist film 240 along the protruding portions 232 of the lands 230. The side walls of the solder resist film 240 at the edges of the openings 550 having a height corresponding to the thickness of the solder resist film 240 serve as dams, and the low wettability of the solder resist film 240 with solder and the surface tension of solder suppress wet-spreading of the molten solder 401. At the same time, since the body portions 231 are smaller than the lands 130, the molten solder 401 also wet-spreads on the portions between the adjacent protruding portions 232. As a result of this, the connecting portions 400 each appear as an approximately quadrangular shape like the pattern (3) of FIG. 7 different from the patterns (1) and (2) in the X-ray transmission image. Since this shape is the most identifiable, the connecting state of the connecting portions 400 is good in this shape, and the height of the connecting portions 400 is appropriate in this shape, the evaluation result is "A" in this case.

In the case where the molten solder 401 is not cooled enough and is not solidified in the state of the pattern (3), the molten solder 401 further wet-spreads, the distance between the electronic component 100 and the printed wiring board 200 in the Z direction is reduced, and the molten solder 401 is squished. In the case where the molten solder 401 wet-spreads to the edges of the openings 550 of the solder resist film 240 and is cooled to solidify, the connecting portions 400 each appear as a shape like the pattern (4) or (5) in the X-ray transmission image. The connecting state of the connecting portions 400 is also good in this case, and the evaluation result is "A".

In the case where the molten solder 401 is not cooled enough and is not solidified in the state of the pattern (5), the molten solder 401 further wet-spreads, and the distance between the electronic component 100 and the printed wiring board 200 in the Z direction is further reduced. The connecting portions 400 each appear as circular shapes having the same size as the openings 550 of the solder resist film 240 like the pattern (6) in the X-ray transmission image. In this case, the evaluation result is "B".

In the case where the paste P is supplied too much, the molten solder 401 goes over the solder resist film 240, and the connecting portions 400 each appear as an abnormal shape like the pattern (7). To be noted, in the case of the pattern (7), no short circuit failure with adjacent connecting portion has occurred. In this case, the evaluation result is "B". Whether or not a short circuit failure has occurred can be easily determined from the X-ray transmission image.

In the case of the pattern (3), (4), or (5), it can be determined that the solder has wet-spread on the lands 130 and 230, and therefore it can be easily determined that the bonding state of the solder is good. In addition, in the case where the solder protrudes out of the openings 550 to have an abnormal shape as in the pattern (7), the printed circuit board 300 can be determined as a good product as long as a short circuit with an adjacent connecting portion 400 has not occurred. However, it can be determined that there is a higher risk for a short circuit, and therefore taking measures such as reconsidering the process conditions in consideration of whether the pattern (7) continuously occurs at the same position in a different lot or the occurrence of the pattern (7) is just temporary also becomes possible. As a cause of the shape of a connecting portion 400 becoming like the pattern (7), excessive supply of the solder paste P, warpage of the electronic component 100 or the printed wiring board 200, and the like can be considered, and optimum measures may be taken appropriately depending on the phenomenon.

In addition, there is also a case where the materials of the lands 130 and the lands 230 are different and the lands 130 have higher wettability with solder, and a case where the lands 130 and the lands 230 are formed from the same material but the wettability of the lands 230 with solder is degraded by some kind of contaminating matter attaching to the lands 230. In these cases, the molten solder 401 is attracted to the lands 130, and an open failure in which the distance between the electronic component 100 and the printed wiring board 200 is large and the solder is separated from the lands 230 occurs. In the case of the pattern (1) or (2), whether or not an open failure has occurred may be determined by an electrical conduction test. To be noted, even if conduction is confirmed as a result of the electrical conduction test, there is still a possibility that disconnection occurs due to deterioration over time. In both cases of the patterns (1) and (2), measures such as reconsidering the process conditions can be taken by checking the state of the lands.

As described above, according to the present exemplary embodiment, which of the patterns (1) to (7) the connecting portions 400 correspond to can be determined from the X-ray transmission image, and therefore the connecting state of the connecting portions 400, that is, whether or not an open failure has occurred can be easily determined. Therefore, the printed circuit board 300 having high reliability of connection by the connecting portions 400 can be obtained.

Modification Examples

Figure 8A:
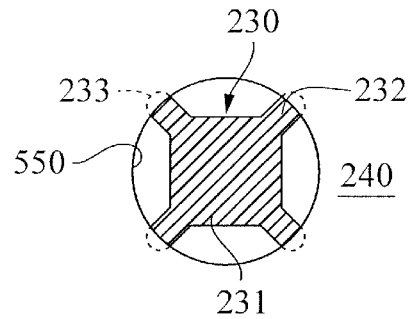
FIGS. 8A to 8F are each an enlarged plan view of a printed wiring board of a modification example.
Figure 8B:
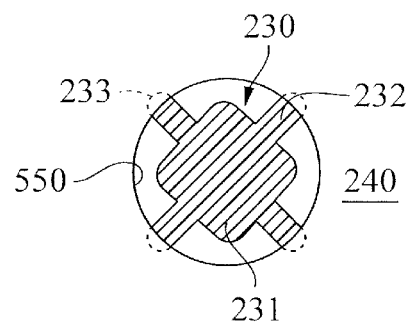
Figure 8C:
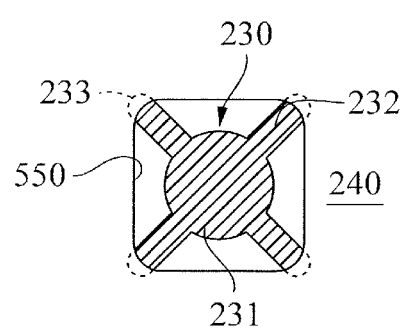
Figure 8D:
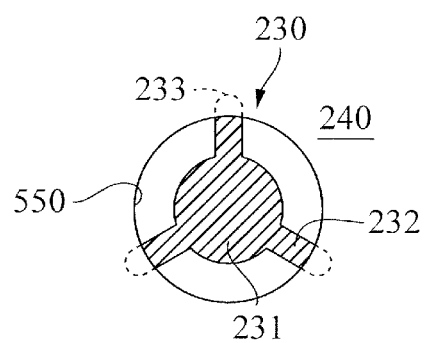
Figure 8E:
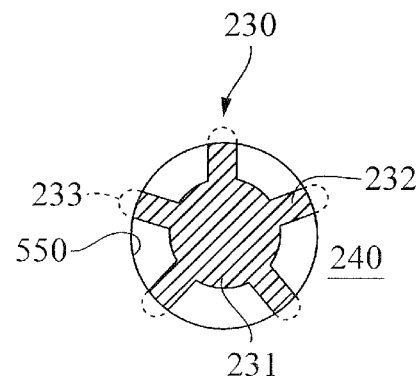
Figure 8F:
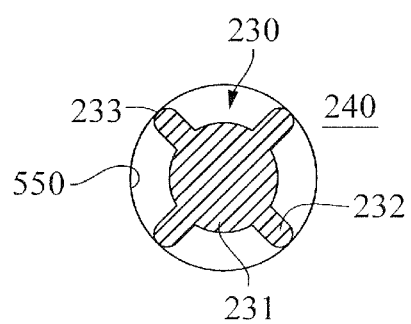

FIGS. 8A to 8F are each an enlarged plan view of a land and the vicinity thereof, which are a part of a printed wiring board of a modification example. Although the shape of the body portion 231 of each land 230 in plan view is preferably a circular shape, the shape is not limited to this, and may be, for example, a quadrangular shape as illustrated in FIGS. 8A and 8B. In addition, although the shape of each opening 550 of the solder resist film 240 in plan view is preferably a circular shape, the shape is not limited to this, and may be, for example, a quadrangular shape as illustrated in FIG. 8C. In addition, although the number of protruding portions 232 protruding from each body portion 231 is preferably 4, the number is not limited to this, and may be, for example, 3 as illustrated in FIG. 8D, or 5 as illustrated in FIG. 8E. In addition, although it is preferable that the distal end 233 of each protruding portion 232 is covered by the solder resist film 240, the configuration is not limited to this, and the distal end 233 does not have to be covered by the solder resist film 240 as illustrated in FIG. 8F. In the case where the distal end 233 is not covered by the solder resist film 240, the protruding portion 232 preferably extends to the edge of the opening 550 of the solder resist film 240. To be noted, the shape of the body portion 231 of each land 230 and the shape of each opening 550 of the solder resist film 240 are not limited to the shapes exemplified above. In addition, although illustration is omitted herein, the shape of each land 130 in plan view is neither limited to a circular shape, and may be a quadrangular shape or a different shape.

In any of these cases, the body portion of a second land is disposed inside an opening provided in a resist portion and further on the inside than an outer edge of a first land in plan view from the Z direction. Further, at least part of the protruding portion protrudes further to the outside than the outer edge of the first land in plan view from the Z direction.

Second Exemplary Embodiment

Figure 9:
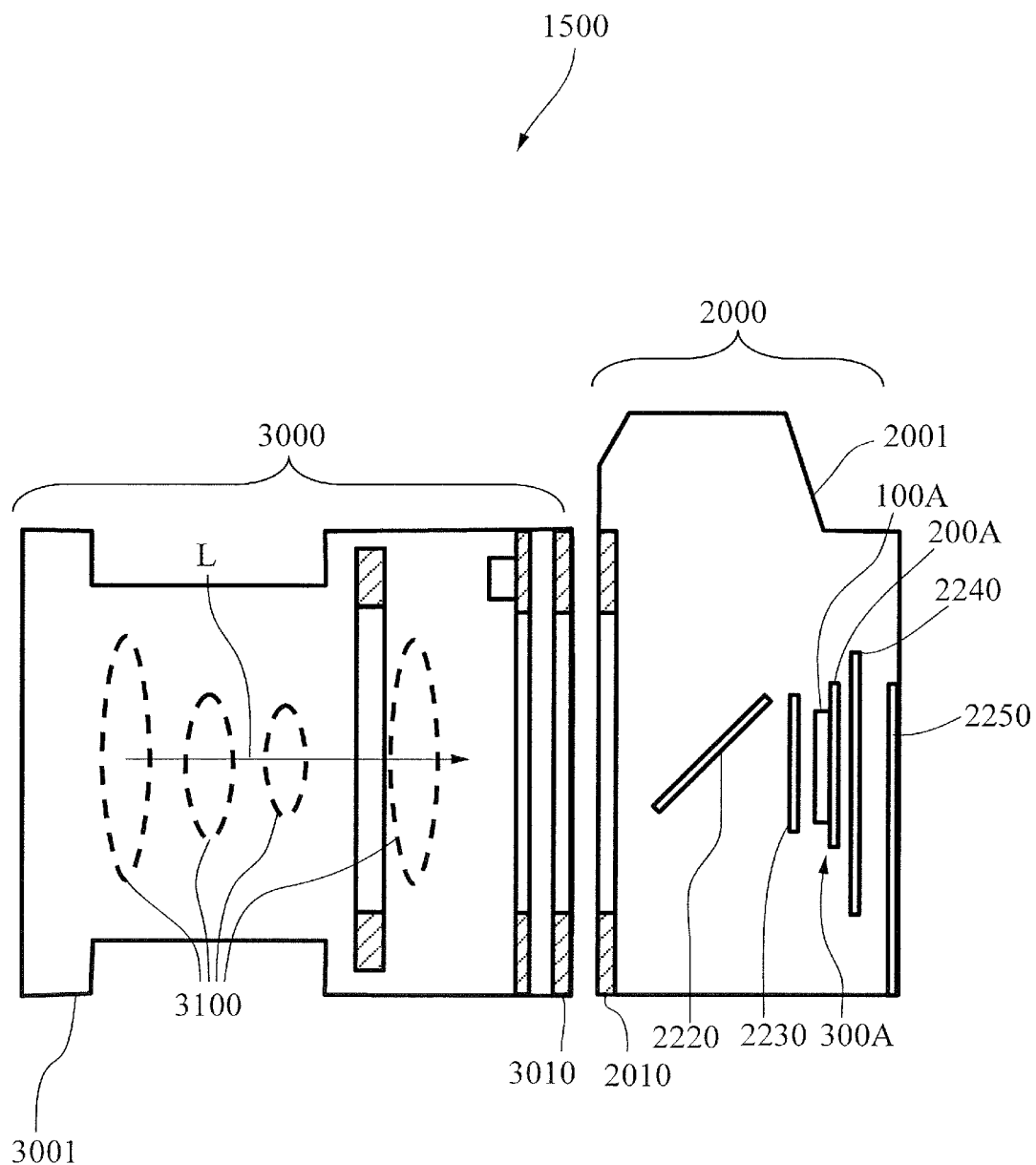
FIG. 9 is an explanatory diagram of an electronic device according to a second exemplary embodiment.

FIG. 9 is an explanatory diagram of a digital camera 1500 that is an image pickup apparatus serving as an example of an electronic device according to a second exemplary embodiment. The digital camera 1500 that is an image pickup apparatus is a digital camera of a lens-replacing type, and includes a camera body 2000. A lens barrel 3000 is attachable to and detachable from the camera body 2000. The camera body 2000 includes a casing 2001, an image pickup unit 300A that is a printed circuit board, and an image processing device 2240. The image pickup unit 300A and the image processing device 2240 are disposed inside the casing 2001. The camera body 2000 includes a liquid crystal display 2250 that is fixed to the casing 2001 in a state of being exposed to the outside of the casing 2001. The image pickup unit 300A includes an image sensor 100A serving as an example of an electronic component, and a printed wiring board 200A on which the image sensor 100A is mounted.

The lens barrel 3000 includes a casing 3001 and an imaging optical system 3100 that is disposed inside the casing 3001 and focuses an optical image on the image sensor 100A when the casing 3001, that is, the lens barrel 3000 is attached to the casing 2001. The imaging optical system 3100 includes a plurality of lens.

The casing 3001 includes a lens side mount 3010 in which an opening is defined, and the casing 2001 includes a camera side mount 2010 in which an opening is defined. The lens barrel 3000, that is, the casing 3001, is attached to the camera body 2000, that is, the casing 2001, by engaging the lens side mount 3010 with the camera side mount 2010. Light traveling in an optical axis direction L of the imaging optical system 3100 is guided to the inside of the casing 2001 through the opening of the lens side mount 3010 of the casing 3001 and the opening of the camera side mount 2010 of the casing 2001. In the casing 2001, a mirror 2220, a shutter 2230, and so forth are provided along the optical axis direction L in front of the image sensor 100A in the optical axis direction L.

The image sensor 100A is, for example, a complementary metal oxide semiconductor: CMOS image sensor or a charge coupled device: CCD image sensor. The image sensor 100A has a function of converting incident light into an electric signal. The image processing device 2240 is, for example, a digital signal processor. The image processing device 2240 has a function of obtaining an electric signal from the image sensor 100A, correcting the obtained electric signal, and generating image data.

Figure 10:
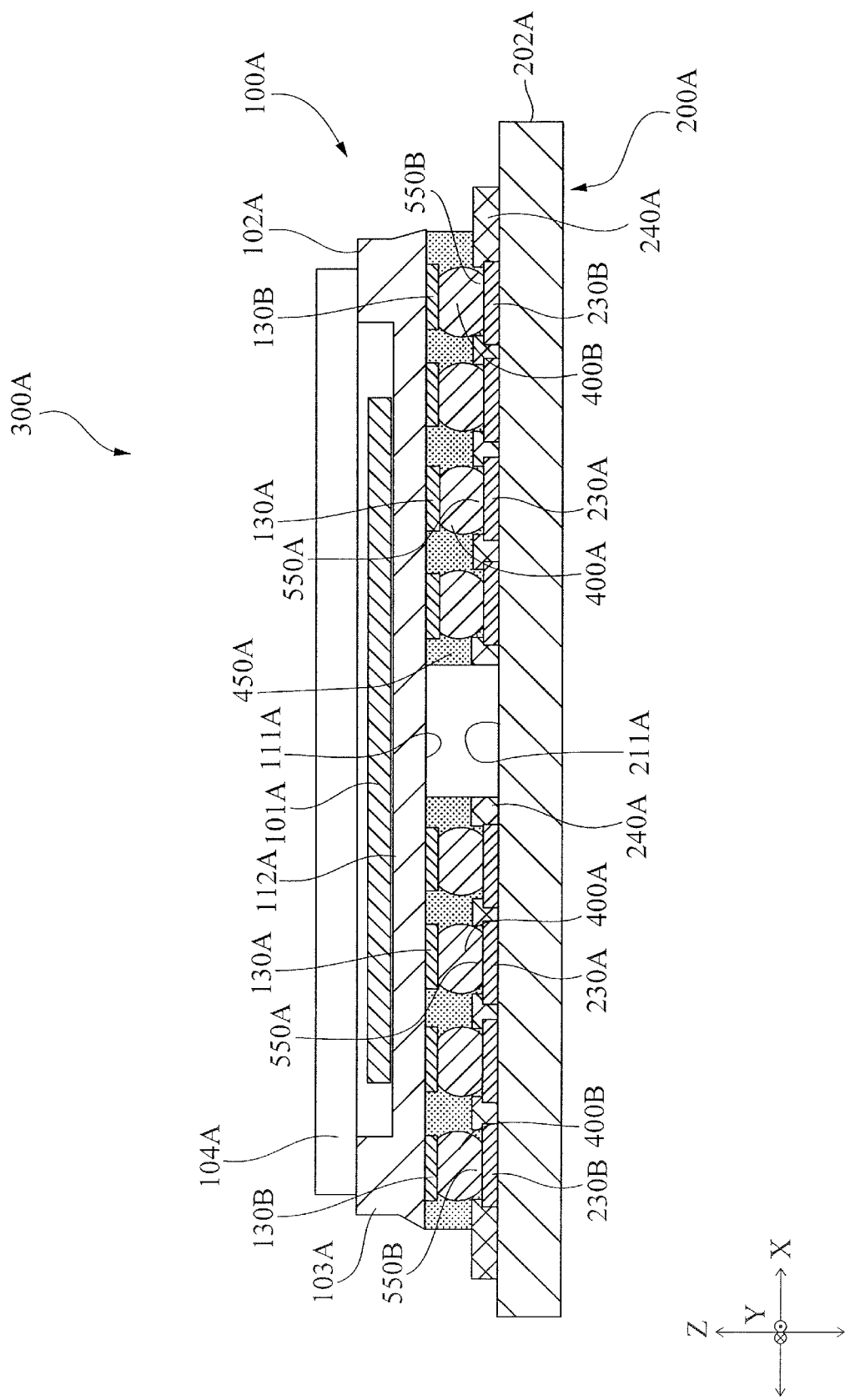
FIG. 10 is a section view of an image pickup unit according to the second exemplary embodiment.

FIG. 10 is a section view of the image pickup unit 300A according to the second exemplary embodiment. The image sensor 100A serving as an electronic component is an LGA package. To be noted, the image sensor 100A may alternatively be a BGA package. The image sensor 100A includes a sensor element 101A serving as a semiconductor element and a package substrate 102A on which the sensor element 101A is mounted. The package substrate 102A includes an insulating substrate 103A and lands 130A and 130B serving as a plurality of first lands disposed on a main surface 111A of the insulating substrate 103A. The sensor element 101A is disposed on a surface 112A of the insulating substrate 103A opposite to the main surface 111A. A glass 104A is disposed on the surface 112A side of the insulating substrate 103A such that the glass 104A is not in contact with the sensor element 101A, and the sensor element 101A is disposed in a hollow portion surrounded by the glass 104A and the insulating substrate 103A. The lands 130A and 130B are electrodes formed from conductive metal such as copper, and, for example, are each a signal electrode, a power source electrode, a ground electrode, or a dummy electrode. The main surface 111A is parallel to the X-Y plane defined by the X direction and the Y direction. In addition, an out-of-plane direction perpendicular to the main surface 111A is defined as the Z direction. For example, the insulating substrate 103A is a ceramic substrate formed from a ceramic such as alumina.

The printed wiring board 200A includes an insulating substrate 202A and lands 230A and 230B serving as a plurality of second lands disposed on a main surface 211A of the insulating substrate 202A. The lands 230A and 230B are electrodes formed from conductive metal such as copper, and, for example, are each a signal electrode, a power source electrode, a ground electrode, or a dummy electrode. The insulating substrate 202A is formed from an insulating material such as epoxy resin.

A solder resist film 240A serving as an example of a resist portion is provided on the main surface 211A. In the solder resist film 240A, openings 550A are defined at positions corresponding to the lands 230A, and openings 550B are defined at positions corresponding to the lands 230B.

The lands 130A and lands 230A are electrically and mechanically connected to each other by connecting portions 400A containing solder. The lands 230A are connected to the lands 130A by the connecting portions 400A through the openings 550A of the solder resist film 240A. The lands 130B and lands 230B are electrically and mechanically connected to each other by connecting portions 400B containing solder. The lands 230B are connected to the lands 130B by the connecting portions 400B through the openings 550B of the solder resist film 240A. In plan view from the Z direction, the connecting portions 400A and 400B are surrounded by resin portion 450A serving as underfill. The resin portions 450A is mainly formed from a cured product of a curable resin. For example, the curable resin is a thermosetting resin. In the present exemplary embodiment, the plurality of connecting portions 400A and 400B are surrounded by one integrated resin portion 450A. To be noted, although it is preferable that the plurality of connecting portions 400A and 400B are surrounded by the one integrated resin portion 450A in plan view from the Z direction, the configuration is not limited to this, and the plurality of connecting portions 400A and 400B may be surrounded by a plurality of separate resin portions.

Figure 11A:
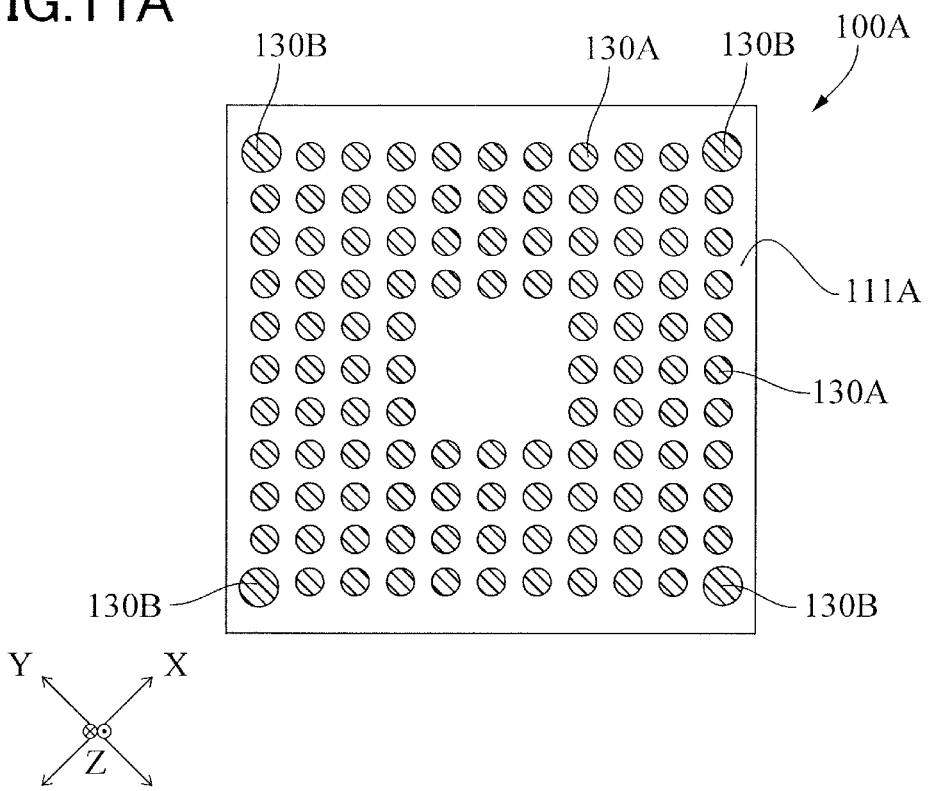
FIG. 11A is a plan view of an image sensor according to the second exemplary embodiment.
Figure 11B:
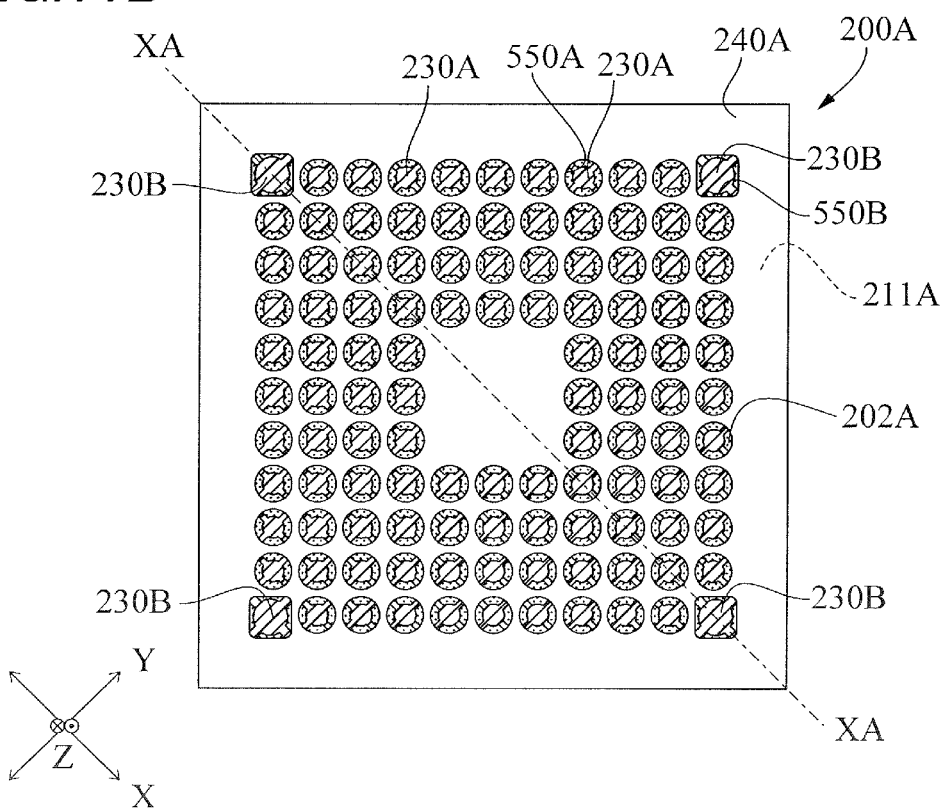
FIG. 11B is a plan view of a printed wiring board according to the second exemplary embodiment.

FIG. 11A is a plan view of the image sensor 100A as viewed from the main surface 111A side. FIG. 11B is a plan view of the printed wiring board 200A as viewed from the main surface 211A side. To be noted, a section view of the image pickup unit 300A illustrated in FIG. 10 is a section view taken along a line XA-XA of FIG. 11B. As illustrated in FIG. 11A, the plurality of lands 130A and 130B are arranged with intervals therebetween in a grid shape, that is, a square lattice shape. Among the plurality of lands 130A and 130B arranged in a lattice shape, the lands 130B are positioned at corner portions of the insulating substrate 103A. The lands 130B are formed to be larger than the lands 130A to enhance the strength of the connecting portions 400B where stress is concentrated.

As illustrated in FIG. 11B, the plurality of lands 230A and 230B are arranged with intervals therebetween in a grid shape, that is, a square lattice shape. Among the plurality of lands 230A and 230B arranged in a lattice shape, the lands 230B are positioned at corner portions of the insulating substrate 202A. The lands 230B are formed to be larger than the lands 230A to enhance the strength of the connecting portions 400B where stress is concentrated. Whereas most part of the main surface 211A of the insulating substrate 202A is covered by the solder resist film 240A, some part of the main surface 211A is present in the openings 550A and 550B provided in the solder resist film 240A.

The method for manufacturing the image pickup unit 300A serving as a printed circuit board and the inspection method for the image pickup unit 300A are similar to the methods for manufacturing and inspecting the printed circuit board according to the first exemplary embodiment, and therefore the description thereof will be omitted.

Figure 12A:
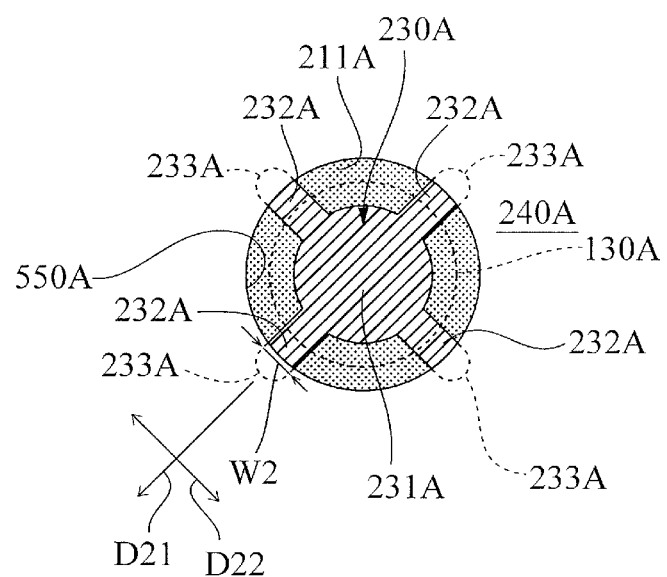
FIGS. 12A and 12B are each an enlarged plan view of a part of the printed wiring board according to the second exemplary embodiment.

FIG. 12A is an enlarged plan view of a land 230A and the vicinity of the land 230A, which are a part of the printed wiring board 200A according to the second exemplary embodiment. To be noted, in FIG. 12A, a land 130A of the image sensor 100A is indicated by a broken line for the sake of convenience of description.

The land 230A includes a body portion 231A, and protruding portions 232A protruding from the body portion 231A. Although the number of protruding portions 232A included in the land 230A may be one or two, the number of protruding portions 232 included in the land 230A is preferably 3 or more, and is 4 in the present exemplary embodiment. The protruding portions 232A are formed to extend radially from the outer periphery of the body portion 231A in plan view from the Z direction. The four protruding portions 232A are arranged at approximately even intervals, that is, at intervals of 90°, in the peripheral direction of the body portion 231A. The entirety of the body portion 231A is formed in an opening 550A of the solder resist film 240A, and part or entirety of each protruding portion 232A is formed in the opening 550A of the solder resist film 240A. In the present exemplary embodiment, part of each protruding portion 232A is formed in the opening 550A. The area of the body portion 231A in the opening 550A is preferably larger than the total area of the plurality of protruding portions 232A, and the body portion 231A serves as a main part of solder bonding.

The lands 130A are formed in circular shapes in plan view from the Z direction. The body portions 231A of the lands 230A are formed in circular shapes in plan view from the Z direction. The openings 550A of the solder resist film 240A are formed in circular shapes in plan view from the Z direction. The openings 550A of the solder resist film 240A are defined to be larger than the lands 130A in plan view from the Z direction.

The body portions 231A are formed to be smaller than the lands 130A in plan view from the Z direction. Therefore, the molten solder 401 illustrated in FIG. 4A also wet-spreads toward the outside of the body portions 231A. In addition, side walls of the openings 550A of the solder resist film 240A also have a role of holding back the molten solder 401. Excessive wet-spreading of the molten solder 401 is suppressed by the side walls of the openings 550A.

The protruding portions 232A are formed to protrude further to the outside than the lands 130A in plan view from the Z direction. The shapes of the connecting portions 400A are controlled by the protruding portions 232A. In the case where an open failure has not occurred, that is, in the case where the connecting state of the connecting portions 400A is good, the connecting portions 400A wet-spread along the protruding portions 232A having high wettability. That is, in the openings 550A, the connecting portions 400A are formed to wet-spread on the body portions 231A, on the plurality of protruding portions 232A, and on portions between adjacent protruding portions among the plurality of protruding portions 232A. Solder more easily wet-spreads on the protruding portions 232A than on the portions of the main surface 211A of the insulating substrate 202A between the pairs of two adjacent protruding portions 232A. Therefore, if the amount of solder is optimum, the connecting portions 400A have shapes corresponding to the protruding portions 232A that are different from circular shapes in plan view.

The lands 130A also appear as shades in the X-ray transmission image. Therefore, in the case where the protruding portions 232A protrude further to the outside than the lands 130A, the connecting portions 400A appear as images larger than and having different shapes from the lands 130A unless an open failure has occurred in the connecting portions 400A. From the viewpoint of controlling the shapes of the connecting portions 400A, the number of protruding portions 232A of each land 230A is preferably 3 or more such that a user can easily identify the shape of each connecting portion 400A in the X-ray transmission image. By setting the number of protruding portions 232A of each land 230A to 3 or more, the connecting portions 400A is more likely to appear as approximately polygonal shapes, which can be easily identified by the user, in the X-ray transmission image. Particularly, the number of protruding portions 232A of each land 230A is preferably 4 to 6. By setting the number of protruding portions 232A of each land 230A to 4 to 6, the connecting portions 400A becomes more likely to appear as approximately quadrangular shapes, approximately pentagonal shapes, or approximately hexagonal shapes, which can be particularly easily identified by the user among the approximately polygonal shapes, in the X-ray transmission image. The number of the protruding portions 232A of each land 230A is particularly preferably 4 among 4 to 6 because the connecting portions 400A are likely to appear as approximately quadrangular shapes, which can be particularly easily identified by the user, in the X-ray transmission image.

The maximum width W2 of each protruding portion 232A in a width direction D22 of the protruding portion 232A perpendicular to a protruding direction D21 thereof may be constant in the protruding direction D21, or may be gradually smaller at a position closer to a distal end 233A thereof in the protruding direction D21. The minimum width of each protruding portion 232A depends on the type and supply amount of the paste, and surface roughness of, material of the lands of, and manufacturing process of the printed wiring board and of the electronic component, and may be of any value as long as the molten solder 401 illustrated in FIG. 4B can wet-spread along the protruding portions 232A. Specifically, from the viewpoint of controlling the shapes of the connecting portions 400A, the maximum width W2 of each protruding portion 232A is preferably 10 μm or more such that the molten solder 401 easily wet-spreads in the protruding direction D21. This is because it is difficult for the molten solder 401 to wet-spread along the protruding portions 232A in the case where the maximum width W2 is smaller than 10 μm. In the case where the number of protruding portions 232A of each land 230A is 4 to 6, the maximum width W2 is preferably 50 μm to 300 μm from the viewpoint of controlling the shapes of the connecting portions 400A.

The distal end 233A of each protruding portion 232A is preferably covered by the solder resist film 240A. This prevents the protruding portions 232A, that is, the lands 230A from peeling off from the main surface 211A of the insulating substrate 202A, and thus improves the reliability of connection by the connecting portions 400A.

Figure 12B:
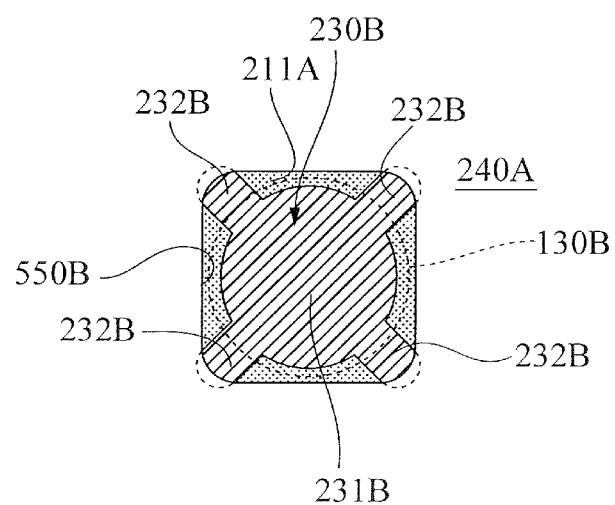

FIG. 12B is an enlarged plan view of a land 230B and the vicinity of the land 230B of the printed wiring board 200A according to the second exemplary embodiment. To be noted, in FIG. 12B, a land 130B of the image sensor 100A is indicated by a broken line for the sake of convenience of description. The land 230B includes a body portion 231B and protruding portions 232B, and has approximately the same structure as the land 230A except for the size thereof. The body portion 231B and the land 130B each have a circular shape in plan view. The openings 550B of the solder resist film 240A each have an approximately quadrangular shape in plan view.

FIG. 13 is an explanatory diagram of an inspection step using an X-ray transmission image according to the second exemplary embodiment. FIG. 13 illustrates patterns of X-ray transmission images of the connecting portions 400A and 400B. The method for evaluation is the same as in the first exemplary embodiment. Also in the second exemplary embodiment, the connection state of the connecting portions 400A and 400B can be easily determined from the shape in the X-ray transmission image similarly to the first exemplary embodiment. As a result of this, the image pickup unit 300A having high reliability of connection by the connecting portions 400A and 400B can be manufactured. To be noted, various modifications such as ones described above with reference to FIGS. 8A to 8F can be made on the lands 230A and 230B and the openings 550A and 550B of the second exemplary embodiment. Various modifications can be made also on the lands 130A and 130B.

Although a case where the lens barrel 3000 is attachable to and detachable from the camera body 2000 has been described in the second exemplary embodiment, the configuration is not limited to this, and the lens and the camera body may be integrated in the camera. In addition, although a case where a camera serves as an example of an electronic device has been described, the configuration is not limited to this, and the electronic device may be a mobile device including an image pickup unit such as a smartphone.

In addition, although a case where the electronic component is an image sensor has been described, the configuration is not limited to this, and the electronic component may be a memory, a memory controller, or any other semiconductor package. In this case, the electronic device including the printed circuit board is not limited to an image pickup apparatus, and the printed circuit board may be incorporated in any kind of electronic device.

Example 1

In Example 1, the printed circuit board 300 was manufactured by the manufacturing method described in the first exemplary embodiment, and the manufactured printed circuit board 300 was inspected. The diameter of each of the lands 130 of the electronic component 100 was set to φ1.0 mm, and the pitch between the lands 130 was set to 1.6 mm. The lands 130 were formed as electrodes plated with Au, Ni, or the like. The thickness of the solder resist film 240 was set to about 0.02 mm. The diameter of each of the openings 550 of the solder resist film 240 was set to φ1.25 mm. The diameter of the body portion 231 of each land 230 was set to φ0.75 mm, which was smaller than that of the land 130. The four protruding portions 232 were formed to extend radially with even intervals therebetween, and the width of each protruding portion 232 was set to 0.2 mm. The insulating substrate 202 of the printed wiring board 200 was formed from an FR-4 base material, and the size thereof was set to about 50.0 mm×about 50.0 mm Cu was used as the material of the lands 230. The number of valid terminals formed from solder was set to 100.

Figure 14:
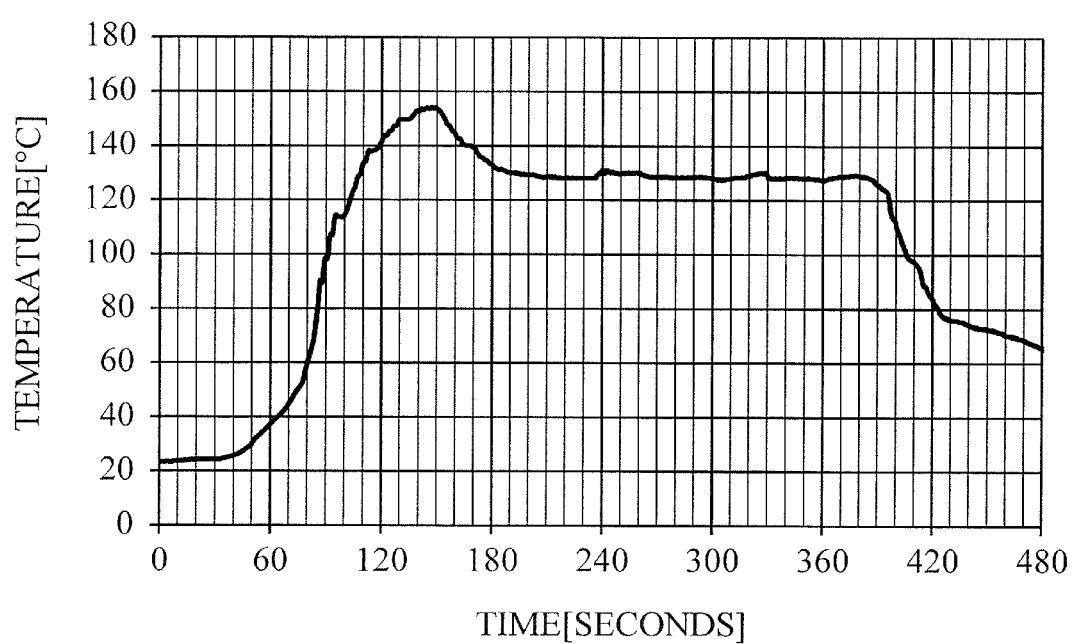
FIG. 14 is a diagram illustrating a profile of reflow heating of an example.

In step S2 illustrated in FIG. 3B, the paste P was supplied onto the printed wiring board 200 by screen printing. A printing plate having a thickness of 0.02 mm was used for the screen printing. The paste P containing a flux component was used. The alloy composition of the solder powder was a eutectic composition of tin-58 bismuth having a melting point of 139° C. The average particle diameter of the solder powder was 40 μm. In step S5-1 illustrated in FIG. 4B and step S5-2 illustrated in FIG. 4C, reflow heating was performed in accordance with a temperature-time profile shown in FIG. 14.

X-ray transmission observation of the printed circuit board 300 manufactured by the conditions described above was performed on the upper surface side. As a result of this, the plurality of connecting portions 400 each corresponded to one of the patterns (3), (4), (5), and (6) among the patterns (1) to (7) shown in FIG. 7. As described above, the connection state of the connecting portions was easily determined in Example 1.

Example 2

In Example 2, the printed circuit board 300A of the second exemplary embodiment was manufactured, and the manufactured printed circuit board 300A was inspected. The size of the insulating substrate 103A of the image sensor 100A was set to 34.0 mm×28.4 mm. The diameter of each of the lands 130A of the image sensor 100A was set to φ1.0 mm, and the pitch between the lands 130A was set to 1.5 mm. The diameter of each of the lands 130B was set to φ1.5 mm. The lands 130A and 130B were formed as electrodes plated with Au, Ni, or the like. The thickness of the solder resist film 240A was set to about 25 μm. The diameter of each of the openings 550A of the solder resist film 240A was set to φ1.25 mm. The size of each of the opening portions 550B having an approximately quadrangular shape was set to 1.75 mm×1.75 mm. The diameter of the body portion 231A of each land 230A was set to φ0.75 mm, which was smaller than that of the land 130A. The four protruding portions 232A were formed to extend radially with even intervals therebetween, and the width of each protruding portion 232A was set to 0.2 mm. The diameter of the body portion 231B of each land 230B was set to φ1.2 mm, which was smaller than that of the land 130B. The four protruding portions 232B were formed to extend radially with even intervals therebetween, and the width of each protruding portion 232B was set to 0.3 mm. The insulating substrate 202A of the printed wiring board 200A was formed from an FR-4 base material, and the size thereof was set to about 50.0 mm×about 50.0 mm Cu was used as the material of the lands 230A and 230B. The number of valid terminals formed from solder was set to 300.

X-ray transmission observation of the image pickup unit 300A manufactured by the conditions described above was performed on the upper surface side. As a result of this, the plurality of connecting portions 400A and 400B each corresponded to one of the patterns illustrated in FIG. 13. As described above, the connection state of the connecting portions was easily determined in Example 2.

Comparative Examples

As printed circuit boards of Comparative Examples, a first sample in which the lands of the printed circuit board did not include the protruding portions 232 and a second sample in which the length of the protruding portions was small were manufactured.

In the first sample of the printed circuit board, the diameter of each opening of the solder resist film was set to φ0.75 mm, and the diameter of each land of the printed wiring board was set to φ0.75 mm, that is, this was configured as a so-called surface mount device: SMD. Other than this, the same conditions as Example 1 were used. In the second sample, the protruding portions were formed to be inside the lands of the electronic component in plan view. X-ray transmission image inspection and electrical conduction test were performed on the first sample and second sample described above.

In X-ray transmission observation of the first sample, the solder shapes of most of the connecting portions were circular shapes of almost the same diameters as the lands of the electronic component or abnormal shapes larger than and deformed from the circular shapes like the pattern (7) shown in FIG. 7. Particularly, even in the case where the solder shapes were the circular shapes of almost the same diameters as the lands of the electronic component, conduction failure was detected in some connecting portions in the electrical conduction test. That is, whether or not the connection state of the connecting portions was good could not be determined by the X-ray transmission image inspection.

In the X-ray transmission image of the second sample, the solder shapes were not the quadrangular shapes like the pattern (3) shown in FIG. 7, and were circular shapes of almost the same diameters as the lands of the electronic component, or the change in the solder shapes in the openings of the solder resist film was unclear. In the second sample, there were not as many connecting portions having abnormal shapes like the pattern (7) shown in FIG. 7 as in the first sample. Since the change in the solder shapes was unclear, whether or not the quality of the product was good could not be determined from the X-ray transmission image, and conditions such as the structure and the process could not be reconsidered.

To be noted, the present invention is not limited to the exemplary embodiments described above, and various modifications can be made within the technical concept of the present invention. In addition, the effects described in the exemplary embodiments are merely enumeration of the most preferable effects that can be realized by the present invention, and the effects of the present invention are not limited to those described in the exemplary embodiments.

Although a case where the insulating substrate of the package substrate is a ceramic substrate has been described, the configuration is not limited to this, and the insulating substrate may be formed from, for example, a glass epoxy material similarly to the printed wiring board. Similarly, although a case where the insulating substrate of the printed wiring board is formed from a glass epoxy material has been described, the insulating substrate of the printed wiring board may be formed from, for example, a ceramic substrate similarly to the package substrate.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-188696, filed Oct. 3, 2018, which is hereby incorporated by reference herein in its entirety.

What is claimed is:

1. A printed circuit board comprising:
a first component including a first land;
a second component including a resist portion, an insulating substrate, and a second land, the second land being provided on the insulating substrate, the second land including a body portion, a first protruding portion, and a second protruding portion, the first protruding portion and the second protruding portion protruding from an outer edge of the body portion, the resist portion being provided on the insulating substrate; and
a connecting portion interconnecting the first land and the second land,
wherein the connecting portion is provided on the body portion, the first protruding portion, the second protruding portion, and a portion of the insulating substrate between the first protruding portion and second protruding portion, and
wherein, in plan view from the first component side, all of the body portion is located within an outer edge of the first land, and portions of the connecting portion provided on the first protruding portion, the second protruding portion, and the portion of the insulating substrate are arranged to be seen outside the outer edge of the first land, and
wherein, in plan view from the first component side, the portion of the connecting portion provided on the portion of the insulating substrate extends in a straight line that connects a position where the first protruding portion is in contact with the wall surface of the resist portion and a position where the second protruding portion is in contact with the wall surface of the resist portion.

2. The printed circuit board according to claim 1, wherein, in plan view from the first component side, a part of the first protruding portion and a part of the second protruding portion overlap with the first land.

3. The printed circuit board according to claim 1,
wherein, in plan view from the first component side, the resist portion is larger than the first land and provided with an opening, and
wherein, in plan view from the first component side, (i) the first land is located inside the opening, and (ii) at least a part of the first protruding portion and at least a part of the second protruding portion are provided between outer edge of the first land and the resist portion.

4. The printed circuit board according to claim 1, wherein, in plan view from the first component side, a portion of the connecting portion provided on the portion of the insulating substrate is arranged to be seen separated from the wall surface of the resist portion.

5. The printed circuit board according to claim 1, wherein, in plan view from the first component side, a distal end of the first protruding portion and a distal end of the second protruding portion are covered by the resist portion.

6. The printed circuit board according to claim 3, wherein, in plan view from the first component side, the first land and the opening have circular shapes.

7. The printed circuit board according to claim 1, wherein the connecting portion contains solder.

8. The printed circuit board according to claim 1, further comprising a resin portion surrounding the connecting portion in plan view from the first component side,
wherein the resin portion interconnects the first component and the second component.

9. The printed circuit board according to claim 1, wherein the first component comprises a semiconductor element and a package substrate on which the semiconductor element is mounted, and the package substrate comprises the first land.

10. The printed circuit board according to claim 9, wherein the first component is an image sensor.

11. The printed circuit board according to claim 1, wherein a maximum width of the first protruding portion and a maximum width of the second protruding portion in a direction perpendicular to a protruding direction thereof are equal to or less than half of a width of the body portion.

12. The printed circuit board according to claim 1, wherein, in plain view from the first component side, the body portion has a circular shape or a quadrangular shape.

13. The printed circuit board according to claim 1, wherein, in plan view, a portion of the connecting portion in contact with the first component has a different shape than a portion of the connecting portion in contact with the second component.

14. An electronic device comprising:
a casing; and
the printed circuit board according to claim 1 disposed inside the casing.

15. The electronic device according to claim 14, wherein the electronic device is an image pickup apparatus.

16. The electronic device according to claim 15, wherein the image pickup apparatus is a camera.

17. The electronic device according to claim 14, wherein the electronic device is a mobile device.

18. The electronic device according to claim 14, wherein the electronic device is a smartphone.

19. A printed circuit board comprising:
a first component including a first land;

a second component including a resist portion, an insulating substrate, and a second land, the second land being provided on the insulating substrate, the second land including a body portion, a first protruding portion, and a second protruding portion, the first protruding portion and the second protruding portion protruding from an outer edge of the body portion, the resist portion being provided on the insulating substrate; and a connecting portion interconnecting the first land and the second land, wherein the connecting portion is provided on the body portion, the first protruding portion, the second protruding portion, and a portion of the insulating substrate between the first protruding portion and second protruding portion, and wherein, in plan view from the first component side, all of the body portion is located within an outer edge of the first land, and portions of the connecting portion provided on the first protruding portion, the second protruding portion, and the portion of the insulating substrate are arranged to be seen outside the outer edge of the first land, and wherein, in plan view from the first component side, the portions of the connecting portion provided on the portion of the insulating substrate extend in straight lines that extend from positions where the first protruding portion is in contact with the wall surface of the resist portion and where the second protruding portion is in contact with the wall surface of the resist portion.

20. An electronic device comprising:

a casing; and the printed circuit board according to claim 19 disposed inside the casing.

* * * * *